US011338431B2

(12) United States Patent
Ono et al.

(10) Patent No.: US 11,338,431 B2
(45) Date of Patent: May 24, 2022

(54) ROBOT

(71) Applicant: Kawasaki Jukogyo Kabushiki Kaisha, Kobe (JP)

(72) Inventors: Ryota Ono, Akashi (JP); Isao Kato, Nishinomiya (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 17/274,454

(22) PCT Filed: Aug. 28, 2019

(86) PCT No.: PCT/JP2019/033732
§ 371 (c)(1),
(2) Date: Mar. 9, 2021

(87) PCT Pub. No.: WO2020/054426
PCT Pub. Date: Mar. 19, 2020

(65) Prior Publication Data
US 2022/0048182 A1  Feb. 17, 2022

(30) Foreign Application Priority Data

Sep. 10, 2018  (JP) .............................. JP2018-168964

(51) Int. Cl.
*B25J 9/04* (2006.01)
*B25J 18/00* (2006.01)
(Continued)

(52) U.S. Cl.
CPC ........... *B25J 9/043* (2013.01); *B25J 15/0014* (2013.01); *B25J 18/007* (2013.01);
(Continued)

(58) Field of Classification Search
CPC ...... B25J 9/043; B25J 15/0014; B25J 18/007; B25J 19/0029; B25J 19/0054; B25J 11/0095
See application file for complete search history.

(56) References Cited

U.S. PATENT DOCUMENTS

| 5,212,432 A * | 5/1993 | Ohtani | ..................... B25J 9/046 |
| | | | 901/49 |
| 2009/0169343 A1* | 7/2009 | Tange | ..................... B25J 9/102 |
| | | | 414/217 |

(Continued)

FOREIGN PATENT DOCUMENTS

| JP | 2007-91433 A | 4/2007 |
| JP | 2014-144527 A | 8/2014 |
| WO | 2015/037701 A1 | 3/2015 |

*Primary Examiner* — Victor L MacArthur
*Assistant Examiner* — Gregory T Prather
(74) *Attorney, Agent, or Firm* — Xsensus LLP

(57) ABSTRACT

A robot includes first and second arms to rotate and convey an object; a first rotary body to support the first arm and having a first fluid passage and at least one second fluid passage communicating with the first fluid passage; a base-end-side arm formed with an internal space and a hole part into which a part of the first rotary body is inserted; a second rotary body to support the second arm and having a third fluid passage communicating at one end thereof with the second fluid passage and communicating at the other end thereof with the internal space; a supplying device disposed in the internal space and connected to an upstream-end side of the first fluid passage, and to supply fluid to the first fluid passage; a first motor to rotate the first rotary body; and a second motor to rotate the second rotary body.

5 Claims, 3 Drawing Sheets

(51) Int. Cl.
*B25J 19/00* (2006.01)
*B25J 15/00* (2006.01)
*B25J 11/00* (2006.01)

(52) U.S. Cl.
CPC ....... *B25J 19/0029* (2013.01); *B25J 19/0054* (2013.01); *B25J 11/0095* (2013.01)

(56) References Cited

U.S. PATENT DOCUMENTS

2013/0156534 A1\* 6/2013 Furukawa .............. B25J 9/1065
    414/744.5
2017/0368695 A1\* 12/2017 Kohzaki .................. B25J 9/126
2021/0354308 A1\* 11/2021 Sullivan ................... B23K 9/04
2022/0016786 A1\* 1/2022 Hatano ................ B25J 19/0054

\* cited by examiner

ROBOT

CROSS-REFERENCE TO RELATED APPLICATIONS

The present application is based on PCT filing PCT/JP2019/033732, filed Aug. 28, 2019, which claims priority to JP 2018-168964, filed Sep. 10, 2018, the entire contents of each are incorporated herein by reference.

TECHNICAL FIELD

The present disclosure relates to a robot which conveys a conveyable object.

BACKGROUND ART

Conventionally, robots which convey a conveyable object, such as a semiconductor wafer, in a vacuum are known. For example, Patent Document 1 discloses a robot which conveys the conveyable object in a vacuum and in which an air-cooling or water-cooling mechanism (a cooling pipe) is disposed in an internal space of a joint part of an arm. Moreover, Patent Document 2 discloses a robot which conveys a conveyable object in a vacuum and in which a tip end of an air pipe led into a hollow arm is disposed at a joint part.

Patent Document 3 discloses a robot which conveys a conveyable object under a high-temperature environment and in which a medium pumping pipe and a medium discharging pipe are disposed inside a hollow arm. One end of the medium pumping pipe is connected to a compressor, and the other end is disposed inside a joint part of a hand. Moreover, one end of the medium discharging pipe is disposed inside a joint part of the arm, and the other end is disposed outside.

REFERENCE DOCUMENTS OF CONVENTIONAL ART

Patent Documents

[Patent Document 1] JP2014-144527A
[Patent Document 2] WO2015/037701A1
[Patent Document 3] JP2007-091433A

DESCRIPTION OF THE DISCLOSURE

Problem to be Solved by the Disclosure

However, since the robots disclosed in Patent Documents 1 and 2 have the cooling pipe inside the arm, the structure inside the arm becomes complicated. Moreover, for example, when two arms are provided, each arm requires the cooling pipe, which increases the cost. Furthermore, the robot disclosed in Patent Document 3 cools its hand but not the arm, and also requires to lead the two pipes into the arm, thus the structure inside the arm being complicated.

Therefore, one purpose of the present disclosure is to provide a robot capable of cooling a plurality of arms with a simple configuration.

SUMMARY OF THE DISCLOSURE

A robot according to one aspect of the present disclosure includes a first arm configured to be rotatable and convey a conveyable object, a second arm configured to be rotatable and convey a conveyable object, a first rotary body configured to be rotatable while supporting the first arm, and having a first fluid passage and at least one second fluid passage communicating with the first fluid passage, a base-end-side arm formed with an internal space and a hole part into which a part of the first rotary body is inserted, a second rotary body having a cylindrical shape, configured to be rotatable while supporting the second arm, and having a third fluid passage communicating at one end thereof with the second fluid passage and communicating at the other end thereof with the internal space, at least a part of the second rotary body being disposed between an inner circumferential surface of the hole part and the first rotary body, a supplying device disposed in the internal space and connected to an upstream-end side of the first fluid passage, and configured to supply fluid to the first fluid passage, a first motor configured to rotate the first rotary body directly or indirectly, and a second motor configured to rotate the second rotary body directly or indirectly.

According to the present disclosure, since the fluid is supplied by the supplying device to the first fluid passage of the first rotary body supporting the first arm, the first rotary body is cooled by the fluid, and thus, the first arm can be cooled by thermal conduction from the first arm to the first rotary body. Moreover, the one end of the second fluid passage of the first rotary body communicating with the first fluid passage, communicates with the third fluid passage provided to the second rotary body. Therefore, since the fluid in the first fluid passage is flown into the third fluid passage via the second fluid passage, the second rotary body is cooled by this fluid. Accordingly, the second arm can be cooled by thermal conduction from the second arm to the second rotary body. Moreover, the fluid supplied to the third fluid passage can be discharged to the internal space of the base-end-side arm. As a result, a flow channel for the fluid can be formed and an accumulation of the fluid can be reduced, and thus, a cooling performance of the fluid can be prevented from being degraded. Furthermore, both of the first arm and the second arm can be cooled by supplying the fluid only to the first fluid passage. In this manner, the plurality of arms can be cooled with the simple configuration without piping being provided.

The first arm may be disposed above the second arm. The first rotary body may support the first arm while the first rotary body is inserted into a hole part formed in the second arm. An upper part of the second rotary body may be disposed at a position lower than an upper part of the first rotary body.

According to this configuration in which the first arm is arranged above the second arm, the first arm can be rotated by the first rotary body while the second arm can be rotated by the second rotary body.

The first arm and the second arm may be disposed in a vacuum and the internal space may be at an atmospheric pressure.

According to this configuration, even in a vacuum environment where heat is not dissipated by convection and easily accumulates, the first arm and the second arm can be suitably cooled by the configuration described above.

The temperature of the conveyable object may be at or above 100° C.

According to this configuration, even when the temperature of the conveyable object is at 100° C. or above, the first arm and the second arm can be suitably cooled.

A robot according to another aspect of the present disclosure includes a first hand configured to convey a conveyable object, a second hand configured to convey a conveyable object, a first arm to which the first hand is attached directly or indirectly, a second arm to which the second hand is attached directly or indirectly, a base-end-side arm formed with an internal space and a hole part communicating the internal space with an external space, a first rotary body configured to rotatably support one of the first arm and the first hand, and having a first fluid passage and a second fluid passage communicating with the first fluid passage, a second rotary body configured to rotatably support one of the second arm and the second hand, and having a third fluid passage communicating with the second fluid passage, and a supplying device disposed in the internal space and directly or indirectly connected to one of the first fluid passage and the third fluid passage, and configured to supply fluid thereto. At least a part of the first rotary body is inserted into the hole part. At least a part of the second rotary body is disposed between an inner circumferential surface of the hole part and the first rotary body.

According to the present disclosure, since the fluid is supplied by the supplying device to the first fluid passage of the first rotary body, the first rotary body is cooled by the fluid, and thus, the first arm can be cooled by thermal conduction from the first hand or the first arm to the first rotary body. Moreover, the second fluid passage communicating with the first fluid passage, communicates with the third fluid passage provided to the second rotary body. Therefore, since the fluid in the first fluid passage is flown into the third fluid passage via the second fluid passage, the second rotary body is cooled by this fluid. Accordingly, the second arm can be cooled by thermal conduction from the second hand or the second arm to the second rotary body. Moreover, the fluid supplied to the third fluid passage can be discharged to the internal space of the base-end-side arm. As a result, a flow channel for the fluid can be formed and an accumulation of the fluid can be reduced, and thus, a cooling performance of the fluid can be prevented from being degraded. Furthermore, both of the first arm and the second arm can be cooled by supplying the fluid only to the first fluid passage. In this manner, the plurality of arms can be cooled with the simple configuration without piping being provided.

Effect of the Disclosure

According to the present disclosure, a robot capable of cooling a plurality of arms with a simple configuration can be provided.

MODE FOR CARRYING OUT THE DISCLOSURE

Hereinafter, one embodiment of the present disclosure is described with reference to the accompanying drawings. A robot described below is merely one embodiment of the present disclosure. Therefore, the present disclosure is not limited to the following embodiment and can be added, omitted, and changed without departing from the spirit of the present disclosure.

Figure 1:
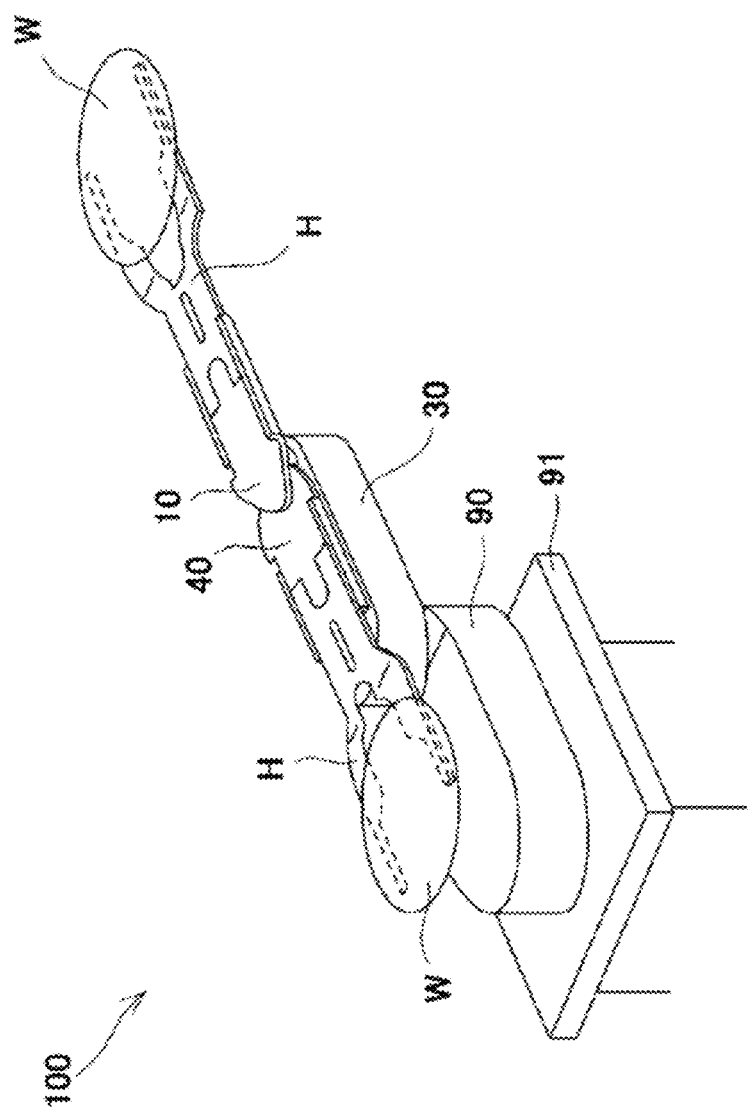
FIG. 1 is a perspective view illustrating a robot according to one embodiment of the present disclosure.
Figure 2:
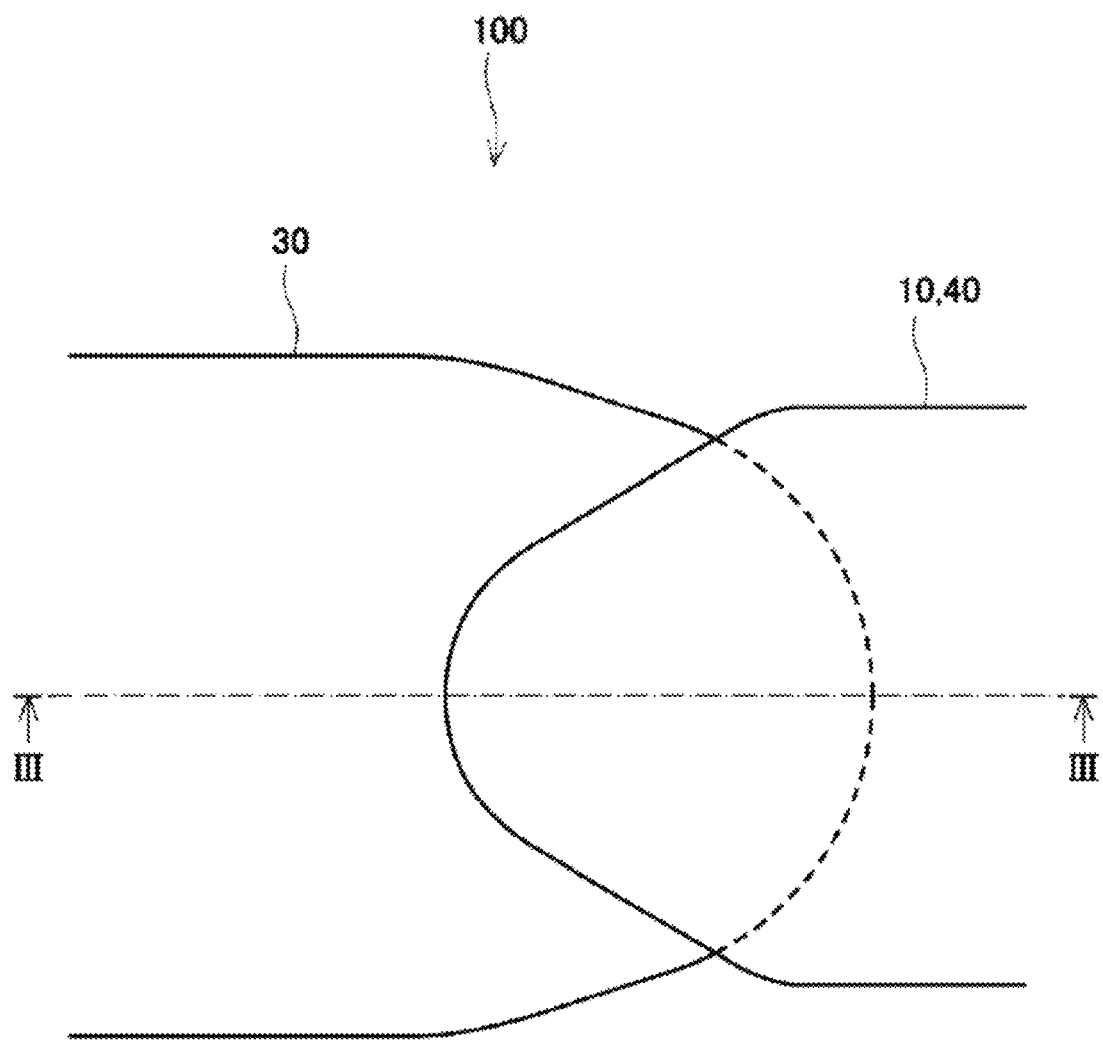
FIG. 2 is a plan view of a part of the robot illustrated in FIG. 1.

As illustrated in FIGS. 1 and 2, a robot 100 according to this embodiment includes a base-end-side arm 30 rotatably provided to a base-side arm 90, a first arm (upper arm) 10 rotatably provided to the base-end-side arm 30, and a second arm (lower arm) 40 rotatably provided to the base-end-side arm 30 so as to be disposed below the first arm 10. A hand H on which a conveyable object W is to be placed is attached to each of the first arm 10 and the second arm 40 on its tip-end side. The hand H of the first arm 10 corresponds to a "first hand," and the hand H of the second arm 40 corresponds to a "second hand" Note that the base-side arm 90 is provided on a base 91.

The conveyable object W to be conveyed by the hand H is a semiconductor wafer, for example. The temperature of the conveyable object W is higher than the temperature of the atmosphere, for example, at 800° C. The hand H conveys the conveyable object W in a vacuum. The hands H, the first arm 10, the second arm 40, the base-end-side arm 30, and the base-side arm 90 are disposed in a vacuum.

Next, a configuration of the robot 100 of this embodiment is described in detail with reference to FIG. 3.

Figure 3:
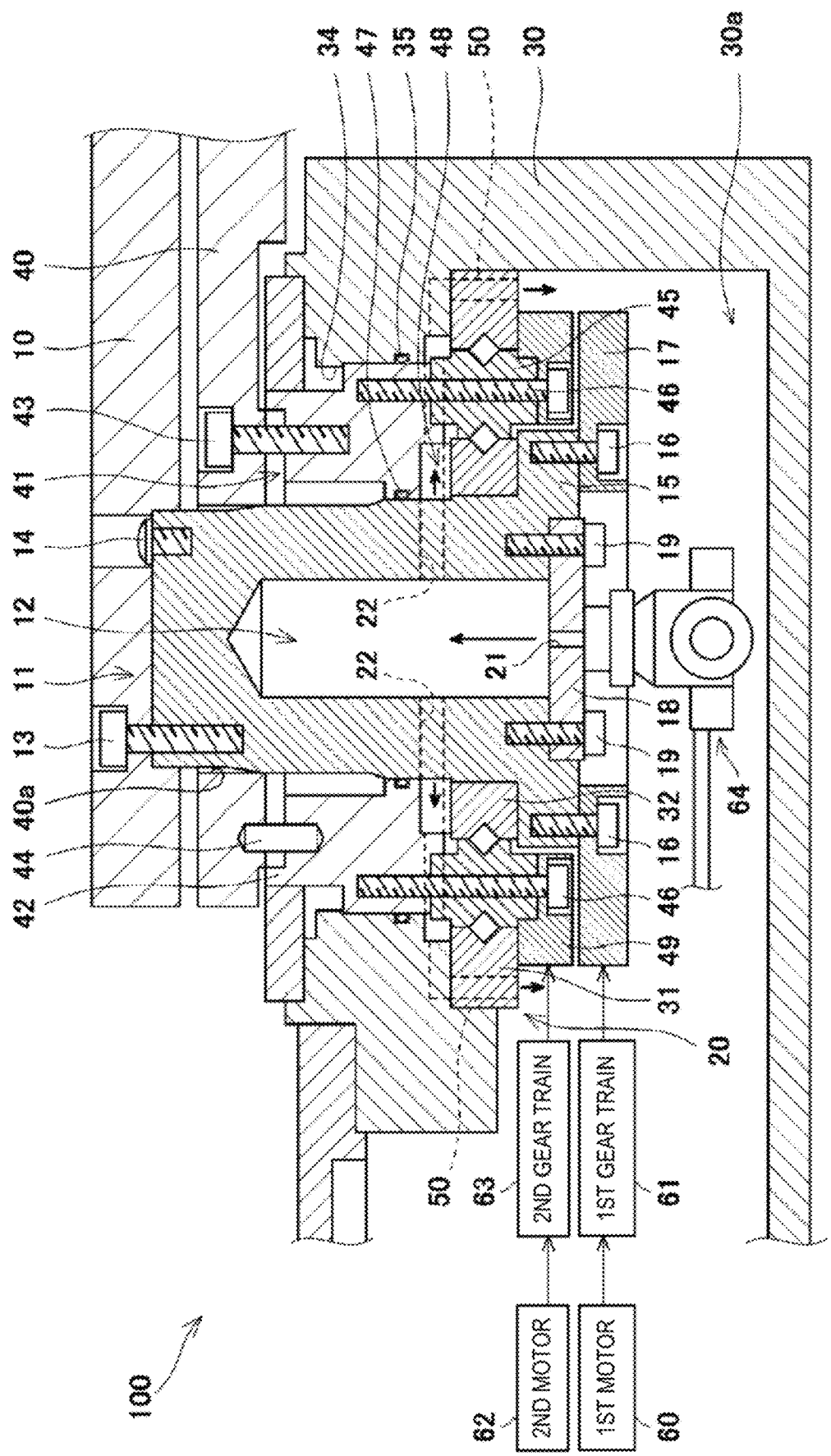
FIG. 3 is a cross-sectional view taken along a line III-III in FIG. 2.

As illustrated in FIG. 3, the robot 100 has a first rotary body 11 having a cylindrical shape with a bottom, which supports the first arm 10, a second rotary body 41 which supports the second arm 40, the base-end-side arm 30 described above having an internal space 30a at an atmospheric pressure and a hole part 34 into which a part of the first rotary body 11 is inserted, and a supplying device 64 which supplies fluid (hereinafter, referred to as "cooling fluid") while being disposed inside the internal space 30a. The supplying device 64 is, for example, an air pump or a compressor, and includes a hose, a pipe, and various fittings. Note that air may be adopted as the cooling fluid in this embodiment.

The first arm 10 is fixed at its lower part on the base-end side to an upper part (bottom part) of the first rotary body 11 inserted into a hole part 40a of the second arm 40 by a bolt 13 and a screw 14 so as to be supported by the first rotary body 11. Moreover, the second arm 40 is fixed at its base-end part to an upper part of the second rotary body 41 by a bolt 43 and a pin 44 so as to be supported by the second rotary body 41.

The first rotary body 11 is provided with a flange part 15 at a circumferential edge on the opening side. A gear 17 is fixed to the flange part 15 by bolts 16. This gear 17 is coupled to a first gear train 61 including a drive gear. The drive gear of the first gear train 61 is rotary driven by a first motor 60. According to this structure, when the first motor 60 operates, the gear 17 rotates via the first gear train 61. As a result, since the first rotary body 11 rotates about its axis, the first arm 10 rotates accordingly.

The first rotary body 11 has a first fluid passage 12 extending in its axial direction, and at least one second fluid passage 22 communicating with the first fluid passage 12. The second fluid passage 22 is formed so as to penetrate a circumferential wall of the first rotary body 11. A downstream end of the second fluid passage 22 communicates, via a space 48 formed between the first rotary body 11 and the second rotary body 41, with a third fluid passage 50 formed through inside the second rotary body 41, a thick wall part of the base-end-side arm 30, and an outer ring part 31 (described later). The downstream end of the third fluid passage 50 communicates with the internal space 30a. Note that although the second fluid passage 22 and the third fluid passage 50 are illustrated by broken lines in FIG. 3, they may be illustrated by solid lines when the cross section is taken along a line with a different angle in FIG. 2.

Next the second rotary body 41 is described. The second rotary body 41 is disposed between an inner circumferential surface of the hole part 34 of the base-end-side arm 30 and the first rotary body 11.

The second rotary body 41 has a cylindrical upper part 42 to which the base-end part of the second arm 40 is fixed, an annular middle ring part 45 fixed to a lower part of the upper part 42 by bolts 46, and a gear 49 fixed to a lower part of the middle ring part 45 by the bolts 46 above the gear 17 described above. The middle ring part 45 is formed with V-shaped grooves on its outer circumferential part and its inner circumferential part, respectively. The gear 49 is coupled to a second gear train 63 including a drive gear. The drive gear of the second gear train 63 is rotary driven by a second motor 62.

Here, the outer ring part 31 having an annular shape is fixed to an inner circumferential surface of the base-end-side arm 30. The outer ring part 31 is formed with a V-shaped groove on its inner circumferential part at a position facing to the V-shaped groove on the outer circumferential part of the middle ring part 45. Moreover, an inner ring part 32 having an annular shape is provided on the flange part 15 of the first rotary body 11. The inner ring part 32 has a V-shaped groove on its outer circumferential part at a position facing to the V-shaped groove on the inner circumferential part of the middle ring part 45. Rollers are provided between the V-shaped groove on the outer ring part 31 and the V-shaped groove on the outer circumferential part of the middle ring part 45, and rollers are provided between the V-shaped groove on the inner circumferential part of the middle ring part 45 and the V-shaped groove of the inner ring part 32. Accordingly, a crossed roller bearing of the first rotary body 11 and a crossed roller bearing of the second rotary body 41 are both achieved. In such a configuration, when the second motor 62 operates, the gear 49 rotates via the second gear train 63. Therefore, the second rotary body 41 rotates independently from the first rotary body 11 about the same axis, and the second arm 40 rotates accordingly.

An annular sealing member 47 is provided between the first rotary body 11 and the upper part 42 of the second rotary body 41. In detail, an annular groove is formed on the upper part 42 of the second rotary body 41 so that the sealing member 47 is fitted therein. Moreover, an annular sealing member 35 is provided between the upper part 42 of the second rotary body 41 and the inner circumferential surface of an upper part of the base-end-side arm 30. In detail, an annular groove is formed on the inner circumferential surface of the upper part of the base-end-side arm 30 so that the sealing member 35 is fitted therein.

A plate 18 is fixed to an opening end of the first rotary body 11 so as to close the opening by bolts 19. The plate 18 is provided at its center part with a supply passage 21 communicating with the first fluid passage 12, with a diameter smaller than that of the first fluid passage 12. A supply port of the supplying device 64 is connected to the supply passage 21. In such a configuration, the cooling fluid discharged from the supplying device 64 is supplied to the first fluid passage 12 of the first rotary body 11 through the supplying passage 21. Accordingly, the first rotary body 11 is cooled by the cooling fluid, and thus, the first arm 10 can be cooled by thermal conduction from the first arm 10 to the first rotary body 11.

Moreover, the second fluid passage 22 communicating with the first fluid passage 12 of the first rotary body 11, communicates at its downstream end with an upstream end of the third fluid passage 50 communicating with the internal space 30a. Therefore, the cooling fluid supplied to the first fluid passage 12 is flown into the third fluid passage 50 via the second fluid passage 22, and thus, the second rotary body 41 is cooled by the cooling fluid. Accordingly, the second arm 40 can be cooled by thermal conduction from the second arm 40 to the second rotary body 41.

As described above, according to the robot 100 of this embodiment, since the cooling fluid is supplied by the supplying device 64 to the first fluid passage 12 of the first rotary body 11 supporting the first arm 10, the first rotary body 11 is cooled by the cooling fluid, and thus, the first arm 10 can be cooled by the thermal conduction from the first arm 10 to the first rotary body 11. Moreover, the downstream end of the second fluid passage 22 of the first rotary body 11 communicating with the first fluid passage 12, communicates with the third fluid passage 50 provided to the second rotary body 41. Therefore, since the cooling fluid of the first fluid passage 12 is flown into the third fluid passage 50 via the second fluid passage 22, the second rotary body 41 is cooled by the cooling fluid. Accordingly, the second arm 40 can be cooled by the thermal conduction from the second arm 40 to the second rotary body 41. Moreover, the cooling fluid supplied to the third fluid passage 50 can be discharged to the internal space 30a of the base-end-side arm 30. As a result, a flow channel for the cooling fluid can be formed and an accumulation of the cooling fluid can be reduced, and thus, a coolability of the cooling fluid can be prevented from being degraded. Furthermore, both of the first arm 10 and the second arm 40 can be cooled by supplying the cooling fluid only to the first fluid passage 12. In this manner, the plurality of arms can be cooled with the simple configuration without piping being provided.

Note that the cooling fluid flown into the space 48 between the first rotary body 11 and the second rotary body 41 may be discharged to the internal space 30a after passing through between the inner ring part 32 and the middle ring part 45. Similarly, the cooling fluid flown into the space 48 may be discharged to the internal space 30a after passing through between the middle ring part 45 and the outer ring part 31. Also according to this, the flow channel for the cooling fluid can be formed and the accumulation of the cooling fluid can further be reduced.

Moreover, even in a vacuum environment like this embodiment where heat is not dissipated by convection and easily accumulates, the first arm 10 and the second arm 40 can be suitably cooled by the configuration described above.

(Modifications)

It is apparent for a person skilled in the art that many improvements and other embodiments of the present disclosure are possible from the above description. Therefore, the above description is to be interpreted only as illustration, and it is provided in order to teach a person skilled in the art the best mode for implementing the present disclosure. The details of the structures and/or the functions may be substantially changed, without departing from the spirit of the present disclosure.

Although in this embodiment the first arm 10 is supported by the first rotary body 11 and the second arm 40 is supported by the second rotary body 41, it is not limited to this. The hands H may be rotatably supported by the first rotary body 11 and the second rotary body 41, respectively.

Moreover, the supplying device 64 may be connected to the third fluid passage 50, and the fluid may be flown through the third fluid passage 50, the second fluid passage 22, and the first fluid passage 12, in this order.

Moreover, the supplying device 64 may be directly or indirectly connected to one of the first fluid passage 12 and the third fluid passage 50, and the other one of the first fluid passage 12 and the third fluid passage 50 may communicate with the internal space 30a of the base-end-side arm 30.

Moreover, although in this embodiment the first arm 10 and the second arm 40 are disposed in a vacuum, it is not limited to this. For example, the present disclosure may be similarly applied to a case where the first arm 10 and the second arm 40 are disposed in the atmosphere and convey the conveyable object W at a high temperature.

Moreover, although in this embodiment air is used as the cooling fluid, it is not limited to this. For example, other cooling fluid such as nitrogen gas and argon may be adopted.

Moreover, although in this embodiment the rotary body 11 is formed in the cylindrical shape with the bottom, it is not limited to this, and may be formed in a cylindrical shape without a bottom.

Moreover, although in this embodiment the temperature of the conveyable object W to be conveyed is at 800° C., it may be at any temperature as long as it is higher than the atmospheric temperature.

DESCRIPTION OF REFERENCE CHARACTERS

10 First Arm
11 First Rotary Body
12 First Fluid Passage
22 Second Fluid Passage
30 Base-End-Side Arm
30a Internal Space
34 Hole Part
40 Second Arm
40a Hole Part
41 Second Rotary Body
50 Third Fluid Passage
60 First Motor
62 Second Motor
64 Supplying Device
100 Robot
H Hand
W Conveyable Object

What is claimed is:

1. A robot, comprising:
a first arm configured to be rotatable and convey a first conveyable object;
a second arm configured to be rotatable and convey a second conveyable object;
a first rotary body configured to be rotatable while supporting the first arm, and having a first fluid passage and at least one second fluid passage communicating with the first fluid passage;
a base-end-side arm formed with an internal space and a hole part into which a part of the first rotary body is inserted;
a second rotary body having a cylindrical shape, configured to be rotatable while supporting the second arm, and having a third fluid passage communicating at one end thereof with the second fluid passage and communicating at the other end thereof with the internal space, at least a part of the second rotary body being disposed between an inner circumferential surface of the hole part and the first rotary body;
a supplying device disposed in the internal space and connected to an upstream-end side of the first fluid passage, and configured to supply fluid to the first fluid passage;
a first motor configured to rotate the first rotary body directly or indirectly; and
a second motor configured to rotate the second rotary body directly or indirectly.

2. The robot of claim 1, wherein the first arm is disposed above the second arm,
wherein the first rotary body supports the first arm while the first rotary body is inserted into a hole part formed in the second arm, and
wherein an upper part of the second rotary body is disposed at a position lower than an upper part of the first rotary body.

3. The robot of claim 1, wherein the first arm and the second arm are disposed in a vacuum and the internal space is at an atmospheric pressure.

4. The robot of claim 1, wherein
the temperature of the first conveyable object is at or above 100° C.

5. A robot, comprising:
a first hand configured to convey a first conveyable object;
a second hand configured to convey a second conveyable object;
a first arm to which the first hand is attached directly or indirectly;
a second arm to which the second hand is attached directly or indirectly;
a base-end-side arm formed with an internal space and a hole part communicating the internal space with an external space;
a first rotary body configured to rotatably support one of the first arm and the first hand, and having a first fluid passage and a second fluid passage communicating with the first fluid passage;
a second rotary body configured to rotatably support one of the second arm and the second hand, and having a third fluid passage communicating with the second fluid passage; and
a supplying device disposed in the internal space and directly or indirectly connected to one of the first fluid passage and the third fluid passage, and configured to supply fluid thereto,
wherein at least a part of the first rotary body is inserted into the hole part, and
wherein at least a part of the second rotary body is disposed between an inner circumferential surface of the hole part and the first rotary body.

* * * * *